United States Patent
Ahn et al.

(10) Patent No.: US 9,887,217 B2
(45) Date of Patent: Feb. 6, 2018

(54) PIXELS OF IMAGE SENSORS, IMAGE SENSORS INCLUDING THE PIXELS, AND IMAGE PROCESSING SYSTEMS INCLUDING THE IMAGE SENSORS

(71) Applicants: Jung Chak Ahn, Yongin-si (KR); Seung Joo Nah, Gwangju (KR); Kyung Ho Lee, Suwon-si (KR); Young Woo Jung, Yongin-si (KR)

(72) Inventors: Jung Chak Ahn, Yongin-si (KR); Seung Joo Nah, Gwangju (KR); Kyung Ho Lee, Suwon-si (KR); Young Woo Jung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 182 days.

(21) Appl. No.: 14/856,618

(22) Filed: Sep. 17, 2015

(65) Prior Publication Data
US 2016/0111461 A1    Apr. 21, 2016

(30) Foreign Application Priority Data
Oct. 16, 2014 (KR) .................. 10-2014-0139915

(51) Int. Cl.
*H01L 27/00* (2006.01)
*H01L 27/146* (2006.01)
(Continued)

(52) U.S. Cl.
CPC .... *H01L 27/14612* (2013.01); *H01L 27/1463* (2013.01); *H01L 27/1464* (2013.01); *H01L 27/14614* (2013.01); *H01L 27/14623* (2013.01); *H01L 27/14638* (2013.01); *H01L 27/14645* (2013.01); *H04N 5/353* (2013.01); *H04N 5/3559* (2013.01); *H04N 5/3592* (2013.01); *H04N 5/37452* (2013.01); *H01L 27/14621* (2013.01); *H01L 27/14627* (2013.01)

(58) Field of Classification Search
CPC .......... H01L 27/14603; H01L 27/1461; H01L 27/14614; H01L 27/14638; H01L 27/14656; H04N 5/37452
See application file for complete search history.

(56) References Cited

U.S. PATENT DOCUMENTS 7,361,877 B2    4/2008  McGrath et al.
7,593,049 B2 *  9/2009  Sekine .................. H04N 3/155
                                                              257/291
(Continued)

FOREIGN PATENT DOCUMENTS

JP    2007-115803    5/2007
JP    2011-061522    3/2011
(Continued)

*Primary Examiner* — Thanh Luu
(74) *Attorney, Agent, or Firm* — Myers Bigel, P.A.

(57) ABSTRACT

Pixels of image sensors are provided. The pixels may include a photo diode configured to accumulate photocharges generated therein corresponding to incident light during a first period, a storage diode configured to store photocharges accumulated in the photo diode and a storage gate configured to control transfer of the photocharges accumulated in the photo diode to the storage diode. The storage gate may include a vertical gate structure extending toward the photo diode.

20 Claims, 14 Drawing Sheets

(51) Int. Cl.
*H04N 5/353* (2011.01)
*H04N 5/355* (2011.01)
*H04N 5/359* (2011.01)
*H04N 5/3745* (2011.01)

(56) References Cited

U.S. PATENT DOCUMENTS

| | | |
|---|---|---|
| 8,471,315 B1 | 6/2013 | Hynecek et al. |
| 8,575,531 B2 | 11/2013 | Hynecek et al. |
| 2011/0032379 A1* | 2/2011 | Kobayashi ........ H01L 27/14603 348/222.1 |
| 2012/0085888 A1 | 4/2012 | Endo et al. |
| 2013/0015513 A1 | 1/2013 | Kido et al. |
| 2013/0032919 A1 | 2/2013 | Watanabe |
| 2013/0044247 A1* | 2/2013 | Kawahito .......... H04N 5/35581 348/296 |
| 2013/0070131 A1 | 3/2013 | Ohkubo et al. |
| 2013/0248937 A1 | 9/2013 | Nozaki et al. |
| 2013/0277535 A1 | 10/2013 | Takeshita et al. |
| 2014/0077058 A1 | 3/2014 | Sakano |
| 2014/0085517 A1 | 3/2014 | Lenchenkov et al. |
| 2014/0085523 A1 | 3/2014 | Hynecek |

FOREIGN PATENT DOCUMENTS

| | | |
|---|---|---|
| JP | 2011-216961 | 10/2011 |
| JP | 2011-249406 | 12/2011 |
| JP | 2012-204524 | 10/2012 |
| KR | 10-1377063 B1 | 3/2014 |

* cited by examiner

PIXELS OF IMAGE SENSORS, IMAGE SENSORS INCLUDING THE PIXELS, AND IMAGE PROCESSING SYSTEMS INCLUDING THE IMAGE SENSORS

CROSS-REFERENCE TO RELATED APPLICATION

This application claims priority under 35 U.S.C. § 119(a) to Korean Patent Application No. 10-2014-0139915 filed on Oct. 16, 2014, the disclosure of which is hereby incorporated by reference in its entirety.

BACKGROUND

Embodiments of the inventive concepts relate to pixels of an image sensor, image sensors including the pixels, and an image processing system including the image sensors, and more particularly, to pixels including transistors which provide improved performance, image sensors including the pixels, and image processing systems including the image sensors.

Image sensors are devices that convert an optical image into an electrical signal. Image sensors are used in digital cameras or other types of image processing devices. Image sensors may include a plurality of pixels.

Mechanical shutter mode and electronic shutter mode are largely used to control an exposure time that determines amount of photocharges corresponding electrical signal. In mechanical shutter mode, a mechanical device blocks light to pixels. Electronic shutter mode is usually used in complementary metal-oxide semiconductor (CMOS) image sensors. In electronic shutter mode, an integration time during which photocharges are generated and accumulated is electrically controlled. Electronic shutter mode includes rolling shutter mode and global shutter mode.

In rolling shutter mode, an integration time is controlled separately for each row in a pixel array. In global shutter mode, an integration time is controlled uniformly throughout all rows in a pixel array.

Global shutter mode has an advantage of eliminating image distortion caused by different integration times among rows. However, it also has some disadvantages in terms of the degree of integration or signal transmission, and therefore, some improvements are desired.

SUMMARY

A pixel of an image sensor may include a photo diode that is configured to accumulate photocharges generated therein corresponding to incident light during a first period, a storage diode that is configured to store photocharges accumulated in the photo diode and a storage gate that is configured to control transfer of the photocharges accumulated in the photo diode to the storage diode. The storage gate may include a vertical gate structure extending toward the photo diode.

In various embodiments, the pixel may further include an overflow gate that is configured to control overflow of the photocharges accumulated in the photo diode into the storage diode during a second period that is different from the first period. The overflow gate may include a vertical gate structure extending toward the photo diode.

According to various embodiments, the pixel may further include a floating diffusion that is configured to receive photocharges stored in the storage diode and a transfer gate that is configured to control transfer of the photocharges stored in the storage diode to the floating diffusion. The transfer gate may include a vertical gate extending toward the storage diode.

According to various embodiments, the vertical gate may be a first vertical gate, and the storage gate may further include a second vertical gate extending toward the storage diode.

In various embodiments, the pixel may also include a photo diode area including the photo diode and a storage diode area including the storage diode. The photo diode area and the storage diode area may be arranged aslant with respect to either of a row direction or a column direction.

In various embodiments, the pixel may also include a floating diffusion that is configured to receive photocharges stored in the storage diode. A voltage level of the floating diffusion may be sensed by an adjacent pixel.

According to various embodiments, the pixel may further include a first deep trench isolation (DTI) at an edge of the pixel for electrical and optical isolation between the pixel and its adjacent pixel.

In various embodiments, the pixel may further include a second deep trench isolation (DTI) between the photo diode and the storage diode to shield the storage diode from the incident light.

In various embodiments, the pixel may also include a light shielding film on the storage diode to shield the storage diode from the incident light.

In various embodiments, the pixel may also include a metal shield on a surface of the storage gate to shield the storage gate from the incident light.

According to various embodiments, the pixel may further include a floating diffusion that is configured to receive photocharges stored in the storage diode, a reset transistor that is configured to control reset of the floating diffusion, a source follower that is configured to generate current corresponding to a voltage level of the floating diffusion and a select transistor that is configured to output the current as a pixel signal.

In various embodiments, an electric potential of the photo diode may be lower than an electric potential of the storage diode.

An image sensor that is configured to operate in global shutter mode may include a pixel array including a plurality of pixels, each of which outputs a pixel signal corresponding to incident light during a first period, a readout circuit that is configured to perform analog-to-digital conversion on the pixel signal to generate a digital pixel signal and a timing generator that is configured to control the pixel array and the readout circuit. Each of the pixels may include a photo diode that is configured to accumulate photocharges generated therein corresponding to the incident light during the first period, a storage diode that is configured to store photocharges accumulated in the photo diode and a storage gate that is configured to control transfer of the photocharges accumulated in the photo diode to the storage diode. The storage gate may include a vertical gate structure extending toward the photo diode.

In various embodiments, each of the plurality of pixels may further include an overflow gate that is configured to control overflow of the photocharges accumulated in the photo diode into the storage diode during a second period that is different from the first period. The overflow gate may include a vertical gate structure extending toward the photo diode.

According to various embodiments, each of the plurality of pixels may further include a floating diffusion that is configured to receive photocharges stored in the storage diode and a transfer gate that is configured to control transfer of the photocharges stored in the storage diode to the floating diffusion. The transfer gate may include a vertical gate extending toward the storage diode.

In various embodiments, the storage gate may also include a vertical gate extending toward the storage diode.

In various embodiments, each of the plurality of pixels may also include a photo diode area including the photo diode and a storage diode area including the storage diode. The photo diode area and the storage diode area may be arranged aslant with respect to either of a row direction or a column direction.

In various embodiments, the image sensor may further include a floating diffusion that is configured to receive photocharges stored in the storage diode. A voltage level of the floating diffusion may be sensed by a pixel adjacent each of the plurality of pixels.

According to various embodiments, each of the plurality of pixels may also include a light shielding unit to shield the storage diode from the incident light.

In various embodiments, the light shielding unit may include a first deep trench isolation (DTI) at an edge of the each of the plurality of pixels for electrical and optical isolation between the each of the plurality of pixels and its adjacent pixel, a second DTI between the photo diode and the storage diode to shield the storage diode from the incident light, a light shielding film on the storage diode to shield the storage diode from the incident light and a metal shield on a surface of the storage gate to shield the storage gate from the incident light.

According to various embodiments, each of the plurality of pixels may further include a floating diffusion that is configured to receive photocharges stored in the storage diode, a reset transistor that is configured to control reset of the floating diffusion, a source follower that is configured to generate current corresponding to a voltage level of the floating diffusion and a select transistor that is configured to output the current as a pixel signal.

A pixel of an image sensor may include a photo diode that is configured to accumulate photocharges generated therein corresponding to incident light, a storage diode that is configured to store photocharges accumulated in the photo diode, a storage gate that is configured to control transfer of the photocharges accumulated in the photo diode to the storage diode during a first period through a vertical storage gate extending toward the photo diode and an overflow gate that is configured to control discharge of photocharges generated in the photo diode during a second period that is different from the first period through a vertical overflow gate that extends toward the photo diode.

In various embodiments, the pixel may further include a floating diffusion that is configured to receive photocharges stored in the storage diode and a transfer gate that is configured to control transfer of the photocharges stored in the storage diode to the floating diffusion. The transfer gate may include a vertical transfer gate extending toward the storage diode.

According to various embodiments, the vertical storage gate may be a first vertical storage gate, and the storage gate may further include a second vertical storage gate extending toward the storage diode.

According to various embodiments, the pixel may also include a light shielding unit that is configured to shield the storage diode from the light incident.

According to various embodiments, the light shielding unit may include a first deep trench isolation (DTI) at an edge of the pixel for electrical and optical isolation between the pixel and its adjacent pixel, a second DTI between the photo diode and the storage diode to shield the storage diode from the incident light, a light shielding film on the storage diode to shield the storage diode from the incident light and a metal shield on a surface of the storage gate to shield the storage gate from the incident light.

An image processing system that is configured to operate in global shutter mode may include an image sensor including a pixel array that may include a plurality of pixels. Each of the plurality of pixels are configured to output a pixel signal corresponding to incident light during a first period and to perform analog-to-digital conversion on the pixel signal to generate a digital pixel signal. The system may also include an image signal processor that is configured to process the digital pixel signal to generate image data. Each of the plurality of pixels may include a photo diode that is configured to accumulate photocharges generated therein corresponding to the incident light during the first period, storage diode that is configured to store photocharges accumulated in the photo diode and a storage gate that is configured to control transfer of the photocharges accumulated in the photo diode to the storage diode. The storage gate may include a vertical gate structure extending toward the photo diode.

A pixel of an image sensor may include a photo diode that is configured to accumulate photocharges generated therein corresponding to incident light, a storage diode that is configured to store photocharges accumulated in the photo diode and a storage gate that is configured to control transfer of the photocharges accumulated in the photo diode to the storage diode. The storage diode and the photo diode may be disposed along a first direction. The storage gate may include a first portion extending in the first direction and a second portion protruding from the first portion and extending toward the photo diode in a second direction that is different from the first direction.

According to various embodiments, the second portion of the storage gate may extend into the photo diode.

In various embodiments, the storage gate may include a third portion protruding from the first portion and extending toward the storage diode.

According to various embodiments, a length of the second portion of the storage gate in the second direction may be greater than a length of the third portion of the storage gate in the second direction.

According to various embodiments, the pixel may further include an overflow gate that is configured to control overflow of the photocharges accumulated in the photo diode into the storage diode. The overflow gate may be spaced apart from the photo diode in the first direction, and the overflow gate may include a third portion extending in the first direction and a fourth portion protruding from the third portion and extending toward the photo diode.

In various embodiments, the pixel may also include a floating diffusion that is configured to receive photocharges from the storage diode and a transfer gate that is configured to control transfer the photocharges stored in the storage diode to the floating diffusion. The storage diode, the transfer gate and the floating diffusion may be arranged in the first direction, and the transfer gate may include a third portion extending in the first direction and a fourth portion protruding from the third portion and extending toward the storage diode.

According to various embodiments, the second direction may be substantially perpendicular to the first direction.

BRIEF DESCRIPTION OF THE DRAWINGS

The above and other features and advantages of the inventive concepts will become more apparent by describing in detail example embodiments thereof with reference to the attached drawings in which.

DETAILED DESCRIPTION OF THE EMBODIMENTS

Figure 1:
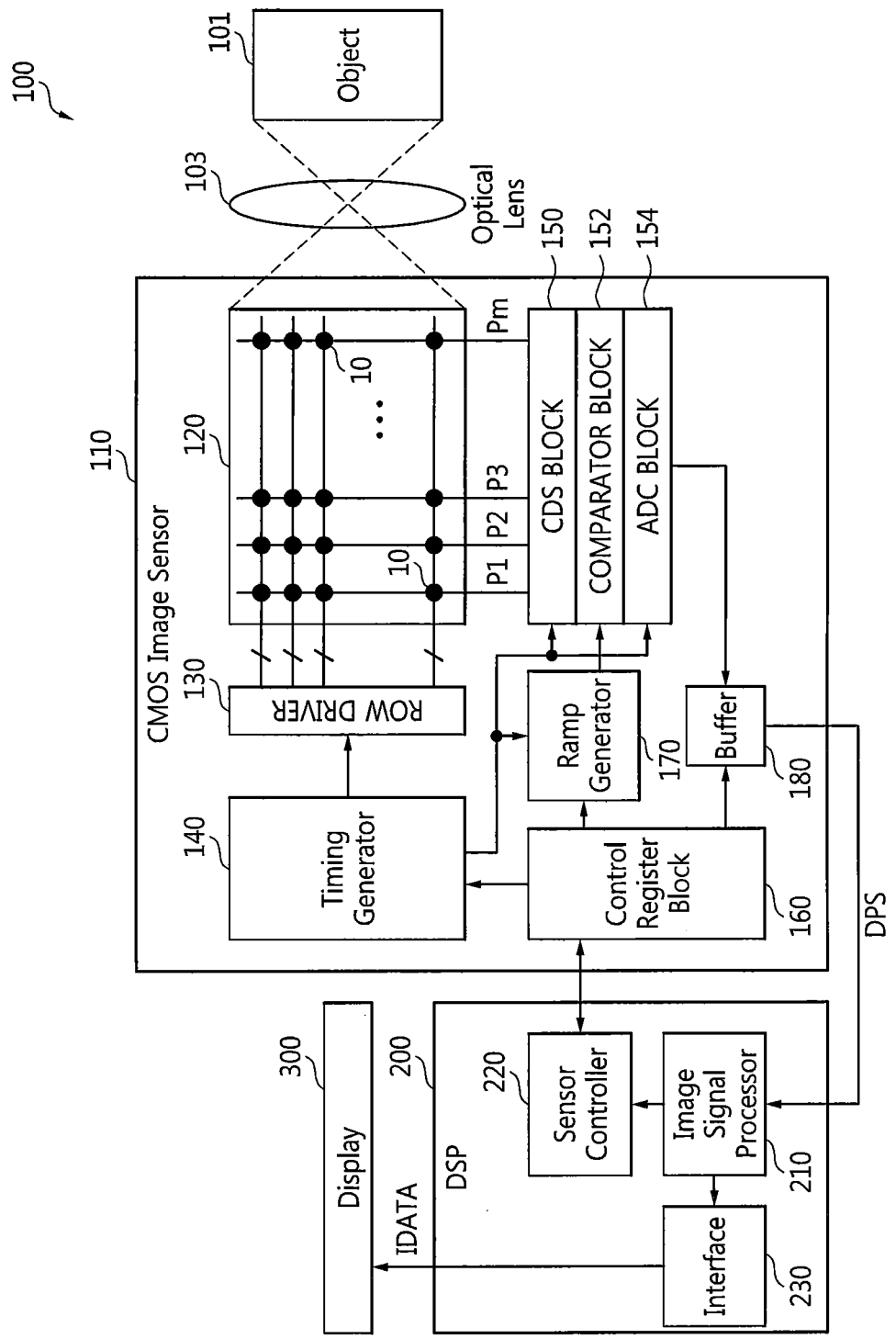
FIG. 1 is a block diagram of an image processing system according to some embodiments of the inventive concepts.

The inventive concepts may be embodied in many different forms, and specific structures or functions are described herein to explain example embodiments of the inventive concepts. The inventive concepts, however, should not be construed as limited to the embodiments set forth herein. The embodiments may be modified in various ways and may have various features and thus illustrated in the drawings and described in detail hereinafter. However, embodiments of the inventive concepts will not be restricted to the specifically disclosed features described below but will include any modifications, equivalents, or substitutes that do not depart from the spirit and scope of the inventive concepts.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other expressions such as "between" and "immediately between" or "adjacent to" and "immediately adjacent to" explaining the relationship between elements will be also interpreted in the same manner.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

The inventive concepts now will be described more fully hereinafter by explaining embodiments of the inventive concepts with reference to the accompanying drawings.

FIG. 1 is a block diagram of an image processing system 100 according to some embodiments of the inventive concepts. The image processing system 100 may be implemented as a portable electronic device such as a laptop computer, a cellular phone, a smart phone, a tablet personal computer (PC), a personal digital assistant (PDA), an enterprise digital assistant (EDA), a digital still camera, a digital video camera, a portable multimedia player (PMP), a mobile internet device (MID), a wearable computer, an internet of things (IoT) device, or an internet of everything (IoE) device.

The image processing system 100 includes an optical lens 103, a complementary metal-oxide-semiconductor (CMOS) image sensor 110, a digital signal processor (DSP) 200, and a display 300. Each of the CMOS image sensor 110 and the DSP 200 may be implemented in a chip.

The CMOS image sensor 110 may generate a digital pixel signal DPS corresponding to an object input (or captured) through the optical lens 103. The CMOS image sensor 110 includes a pixel (or an active pixel sensor (APS)) array 120, a row driver 130, a timing generator 140, a correlated double sampling (CDS) block 150, a comparator block 152, an analog-to-digital conversion (ADC) block 154, a control register block 160, a ramp generator 170, and a buffer 180.

The CMOS image sensor 110 may perform a global shutter operation. In global shutter operation, an integration time (e.g., Tint in FIG. 9) during which photodiodes (e.g., PD in FIG. 4) in the pixel array 120 accumulate photocharges may be controlled uniformly throughout all rows in the pixel array 120.

The pixel array 120 includes a plurality of pixels 10 arranged in a matrix. The structures and operations of the pixel array 120 and the pixels 10 will be described in detail with reference to FIGS. 2 through 10F later. Each of the pixels 10 may be referred to as a unit pixel in a regard that the pixels 10 form one pixel array 120.

The row driver 130 may transmit a plurality of control signals OS, RS, SS, TS, SLS, and FDB for controlling the operation of the pixels 10 to the pixel array 120 according to the control of the timing generator 140. The control signals OS, RS, SS, TS, SLS, and FDB will be described in detail with reference to FIGS. 8 through 10F later.

The timing generator 140 may control the operations of the row driver 130, the CDS block 150, the ADC block 154, and the ramp generator 170 according to the control of the control register block 160.

The CDS block 150 performs correlated double sampling (CDS) on pixel signals P1 through Pm (where "m" is a natural number) output from respective column lines formed in the pixel array 120. The comparator block 152 compares pixel signals (e.g., voltage levels) that have been subjected to CDS in the CDS block 150 with a ramp signal (e.g., a voltage level) output from the ramp generator 170 and outputs comparison signals according to the comparison result.

The ADC block 154 converts the comparison signals received from the comparator block 152 into digital signals and outputs the digital signals to the buffer 180. The CDS block 150, the comparator block 152, and the ADC block 154 may form a readout circuit.

The control register block 160 controls the operations of the timing generator 140, the ramp generator 170, and the buffer 180 according to the control of the DSP 200. The buffer 180 transmits digital pixel signals DPS corresponding to the digital signals output from the ADC block 154 to the DSP 200. The DSP 200 includes an image signal processor 210, a sensor controller 220, and an interface 230.

The image signal processor 210 controls the interface 230 and the sensor controller 220 which controls the control register block 160. The image sensor 110 and the DSP 200 may be respectively implemented in chips in a single package, e.g., a multi-chip package. In some embodiments, the image sensor 110 and the image signal processor 210 may be respectively implemented in chips in a single package, e.g., a multi-chip package. In some embodiments, the image sensor 110 and the image signal processor 210 may be implemented in a single chip.

The image signal processor 210 processes the digital pixel signals DPS received from the buffer 180 and transmits processed image data IDATA to the interface 230. The sensor controller 220 generates various control signals for controlling the control register block 160 according to the control of the image signal processor 210. The interface 230 transmits the processed image data IDATA from the image signal processor 210 to the display 300.

The display 300 displays the image data IDATA output from the interface 230. The display 300 may be a thin film transistor-liquid crystal display (TFT-LCD), a light emitting diode (LED) display, an organic LED (OLED) display, or an active-matrix OLED (AMOLED) display.

Figure 2:
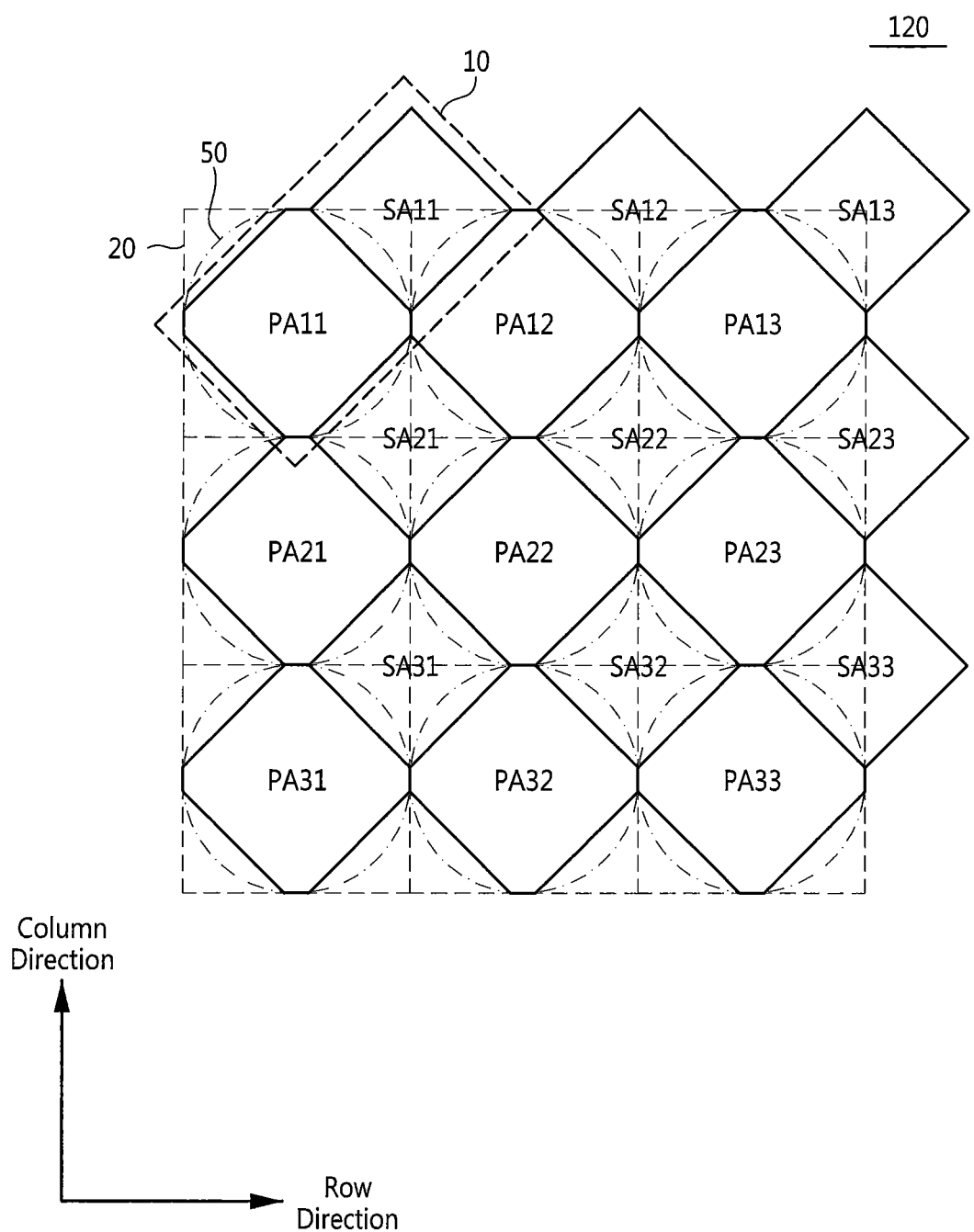
FIG. 2 is a diagram of a pixel array according to some embodiments of the inventive concepts.

FIG. 2 is a diagram of the pixel array 120 according to some embodiments of the inventive concepts. Referring to FIGS. 1 and 2, it is assumed that the pixel array 120 includes only nine pixels 10 arranged in a 3×3 matrix with three rows and three columns. For convenience' sake in the description, it is described that the pixel array 120 includes nine pixels 10, but inventive concepts are not restricted thereto. The pixel array 120 may have an n×m matrix format, where "n" and "m" are integer of at least 1.

3×3 pixel regions 20 are arranged in parallel or vertical to a row direction and a column direction. Each pixel region 20 may include a micro lens 50 that focuses incident light coming through the optical lens 103 on the center of the pixel region 20.

Each of the pixels 10 may include one of photo diode areas PA11 through PA33 and one of storage diode areas SA11 through SA33. For instance, a pixel 10 at the intersection between a second row and a second column includes the photo diode area PA22 and the storage diode area SA22.

The photo diode areas PA11 through PA33 may include a photo diode (e.g., PD in FIG. 4) that accumulates photocharges generated therein corresponding to incident light. The photo diode PD may occupy most of each of the photo diode areas PA11 through PA33. The center of each of the photo diode areas PA11 through PA33 may coincide with the center of the pixel region 20, so that the micro lens 50 focuses incident light on the photo diode PD of each of the photo diode areas PA11 through PA33.

The storage diode areas SA11 through SA33 may include a storage diode (e.g., SD in FIG. 4) that temporarily stores photocharges accumulated in the photo diode PD in order to realize global shutter mode. The storage diode areas SA11 through SA33 may be formed at an angle of 45 degrees with respect to the photo diode areas PA11 through PA33, respectively. The storage diode SD may occupy most of each of the storage diode areas SA11 through SA33.

Each storage diode area, e.g., SA22 may be arranged adjacent to a photo diode area, e.g., PA22 included in the same pixel 10 as the storage diode area SA22. The photo diode area PA22 and the storage diode area SA22 may be arranged aslant with respect to the row direction and/or the column direction. For instance, the photo diode area PA22 and the storage diode area SA22 may be arranged at an angle of 45 degrees with respect to the row direction and/or the column direction.

The micro lens 50 may be formed to correspond to the photo diode PD. Here, that the micro lens 50 corresponds to the photo diode PD may mean that the micro lens 50 has an area matching an area of the photo diode PD and is formed to overlap most of the area of the photo diode PD. Meanwhile, the micro lens 50 may be formed not to correspond to the storage diode SD. In other words, the micro lens 50 may have an area which does not match an area of the storage diode SD and may be formed not to overlap most of the area of the storage diode SD. This means that when micro lenses 50 are placed in the pixel regions 20, a storage diode area, e.g., SA21 may be arranged between adjacent micro lenses 50, for example, the micro lenses 50 respectively corresponding to the photo diode areas PA11, PA12, PA21, and PA22.

The photo diode areas PA11 through PA33 are formed to correspond to the respective micro lenses 50 as much as possible and the storage diode areas SA11 through SA33 are formed in areas outside the photo diode areas PA11 through PA33, so that the arrangement efficiency or the degree of integration of the pixels 10 is increased.

In addition, since the micro lenses 50 are not formed to correspond to the storage diode areas SA11 through SA33 and formed to correspond to the photo diode areas PA11 through PA33 only, light absorptance is increased and light leakage is decreased. The light absorptance may be the amount of light that can be absorbed per unit area. The light leakage may be a phenomenon in which noise occurs in the pixel signals P1 through Pm because the storage diode SD that is supposed to store photocharges only generated by the photo diode PD stores other photocharges (e.g., photocharges generated from light incident on the storage diode SD).

The storage diode areas SA11 through SA33 may be formed at an angle of 135, 225 or 315 degrees to the respective photo diode areas PA11 through PA33 in some embodiments.

Figure 3:
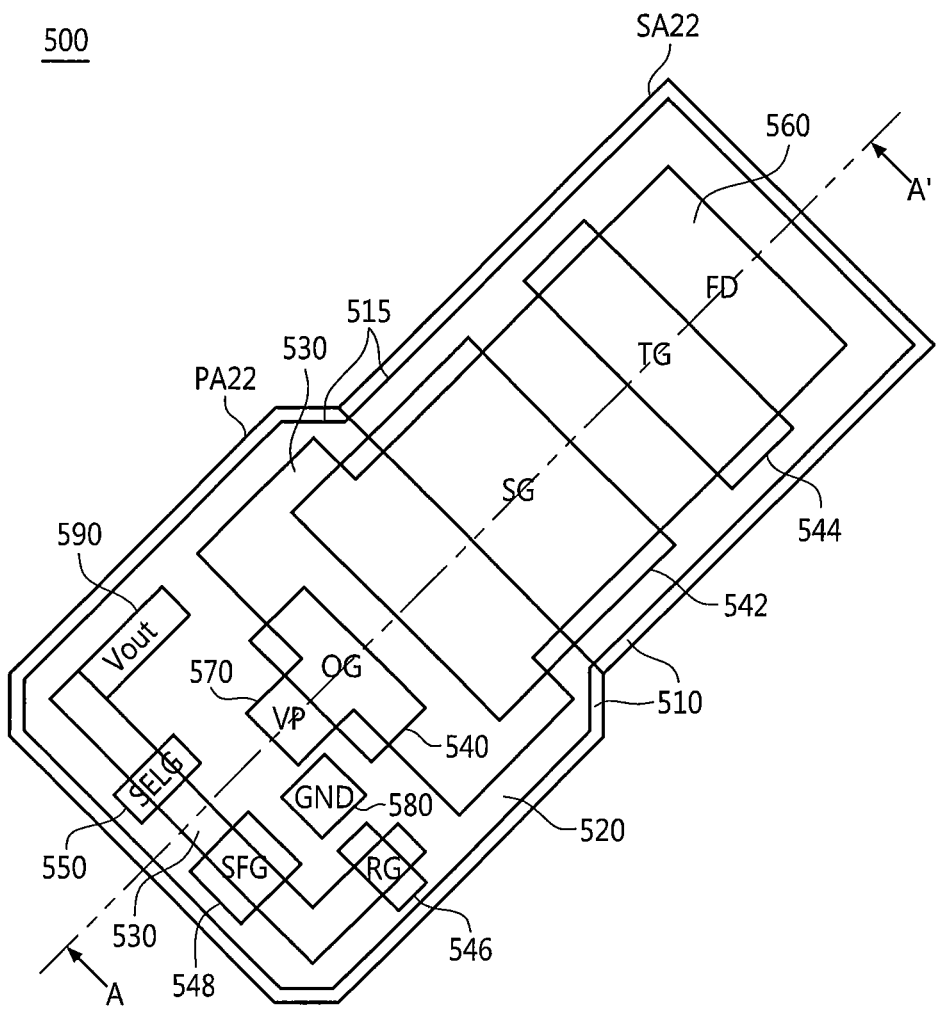
FIG. 3 is a layout of a pixel according to some embodiments of the inventive concepts.

FIG. 3 is a diagram of a layout of a pixel according to some embodiments of the inventive concepts. Referring to FIGS. 1 through 3, the layout 500 is a layout of the pixel 10 positioned at the intersection between the second row and the second column among the pixels 10 illustrated in FIG. 2. The layout 500 shows the arrangement of elements included in the pixel 10.

The layout 500 may include the photo diode area PA22 and the storage diode area SA22. The photo diode area PA22 and the storage diode area SA22 may include a deep trench isolation (DTI) region 510 and an active region 515.

The DTI region 510 may be formed at the edge of the active region 515 for electrical or optical isolation from an active region (not shown) of an adjacent pixel (not shown). The DTI region 510 formed using a DTI process may be filled with oxide, for example, such as hafnium oxide, and/or polysilicon. For instance, the DTI region 510 may be formed of a polysilicon film doped with boron with high reflectance, but the inventive concepts are not limited thereto. The DTI region 510 may include material other than polysilicon doped with boron.

The DTI region 510 may reduce or possibly prevent electric crosstalk which causes a signal-to-noise ratio (SNR) to decrease due to exchange of carriers between active regions. In addition, sidewalls of the DTI region 510 may be doped with a material with high light reflectance, thereby reducing or possibly preventing optical crosstalk which causes an SNR to decrease because light incident on the active region 515 penetrates an adjacent active region (not shown). For instance, the sidewalls of the DTI region 510 may be formed of a polysilicon film doped with boron having high reflectance, but the inventive concepts are not limited thereto.

The active region 515 may include a shallow trench isolation (STI) 520, a well 530, a gate OG or 540 of an overflow transistor OX, a gate SG or 542 of a storage transistor SX, a gate TG or 544 of a transfer transistor TX, a gate RG or 546 of a reset transistor RX, a gate SFG or 548 of a source follower SF, a gate SELG or 550 of a select transistor SEL, a floating diffusion 560, a pixel voltage terminal VP or 570, a ground terminal GND or 580, and an output terminal 590. The arrangement of elements included in the active region 515 is not limited to that illustrated in FIG. 3 and may be modified.

The STI 520 may be formed around the other elements in the inside of the DTI region 510. The STI 520 may be formed using an STI process to electrically isolate the elements. The STI 520 may shallower than the DTI region 510. The inside of the STI 520 may be formed of substantially the same material as the DTI region 510.

The well area 530 is doped with p- or n-type impurities. It may be formed to electrically isolate elements from one another. A region highly doped with impurities (e.g., p++ or n++ impurities) may be formed in the well area 530. This highly doped region may function as a source terminal and/or drain terminal of each of the overflow transistor OX, the storage transistor SX, the transfer transistor TX, the reset transistor RX, the source follower SF, and the select transistor SEL. The well area 530 may electrically insulate the highly doped region.

The gate 540 of the overflow transistor OX, the gate 542 of the storage transistor SX, the gate 544 of the transfer transistor TX, the gate 546 of the reset transistor RX, the gate 548 of the source follower SF, and the gate 550 of the select transistor SEL may respectively receive the control signals OS, SS, TS, RS, and SLS, which will be described with reference to FIG. 8 later. The gate 548 of the source follower SF may be connected to the floating diffusion 560. The gates 540 through 550 may be formed of polysilicon.

The gate 540 of the overflow transistor OX, the gate 542 of the storage transistor SX, the gate 544 of the transfer transistor TX, and the floating diffusion 560 may be sequentially arranged in a line. As shown in FIG. 8, photocharges accumulated at the photo diode PD are transferred from the photo diode PD to the storage diode SD and then to a floating diffusion FD.

The shorter the length of a channel among the photo diode PD, the storage diode SD, and the floating diffusion FD and the wider the channel, the higher the transfer efficiency of the photocharges. Accordingly, in order to maximize the transfer efficiency of photocharges among the photo diode PD, the storage diode SD, and the floating diffusion FD, the elements 540, 542, 544, and 560 may be sequentially arranged in a line, as shown in FIG. 3.

The transfer of charges among the photo diode PD, the storage diode SD, and the floating diffusion FD is carried out in a very short section. Therefore, when the transfer efficiency is not satisfactory, all photocharges accumulated in the photo diode PD may not be transferred to the floating diffusion FD. This may cause noise in the pixel signals P1 through Pm.

The floating diffusion 560 may be formed adjacent to the gate 544 of the transfer transistor TX. The floating diffusion 560 is a node which photocharges generated in the photo diode PD are transferred to through the storage transistor SX and the transfer transistor TX and accumulated at. The floating diffusion 560 may be connected to the gate 548 of the source follower SF, so that the voltage level of the floating diffusion 560 may be sensed by the source follower SF and the source follower SF may transmit a current corresponding to the voltage level to the select transistor SEL.

In some embodiments, the floating diffusion 560 may be connected to a gate (not shown) of a source follower of an adjacent pixel (e.g., a pixel including the photo diode area PA13 and the storage diode area SA13) instead of the gate 548 of the source follower SF. The voltage level of the floating diffusion 560 may be sensed by the source follower included in a photo diode area of the adjacent pixel (e.g., PA13) and the source follower may transfer a current corresponding to the voltage level to a select transistor (not shown) included in a photo diode area of the adjacent pixel (e.g., PA13). Here, the adjacent pixel may be any pixel in a row different from that the layout 500 is in.

The pixel voltage terminal 570 may supply a pixel voltage Vpix necessary for the operation of the pixel 10 corresponding to the layout 500. For instance, the pixel voltage terminal 570 may apply the pixel voltage Vpix to the drain terminal of each of the overflow transistor OX, the reset transistor RX, and the source follower SF. The pixel voltage Vpix may be equal to or lower than a power supply voltage VDD, but the inventive concepts is not limited thereto.

The ground terminal 580 may supply a ground voltage VSS necessary for the operation of the pixel 10 corresponding to the layout 500. For instance, the ground terminal 580 may apply the ground voltage VSS to one end of each of the photo diode PD and the storage diode SD. The output terminal 590 may be connected to the source terminal of the storage transistor SX to output a pixel signal from the source terminal to a column line.

Figure 4:
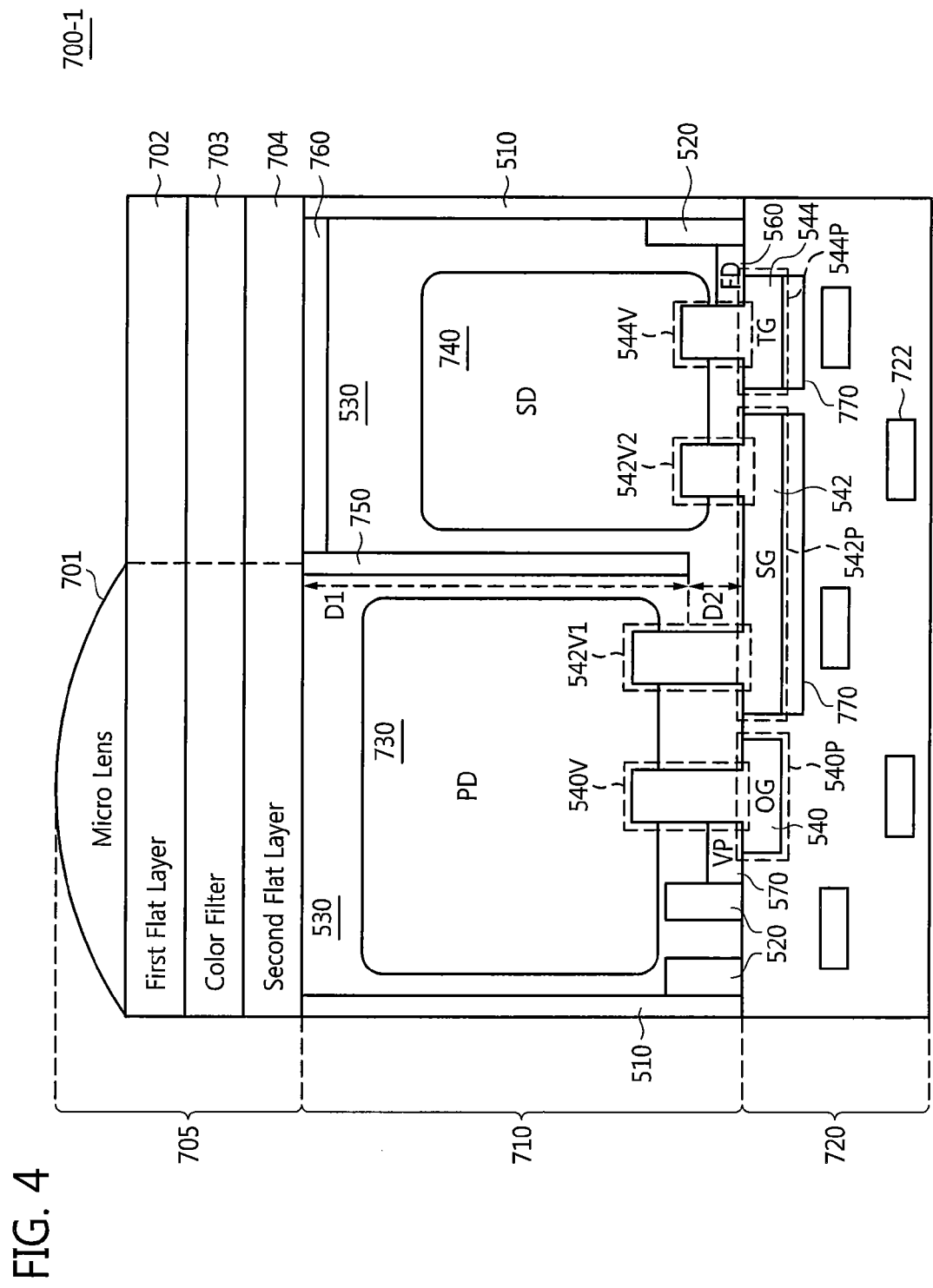
FIG. 4 is a cross-sectional view of the pixel illustrated in FIG. 3 according to some embodiments of the inventive concepts.
Figure 5:
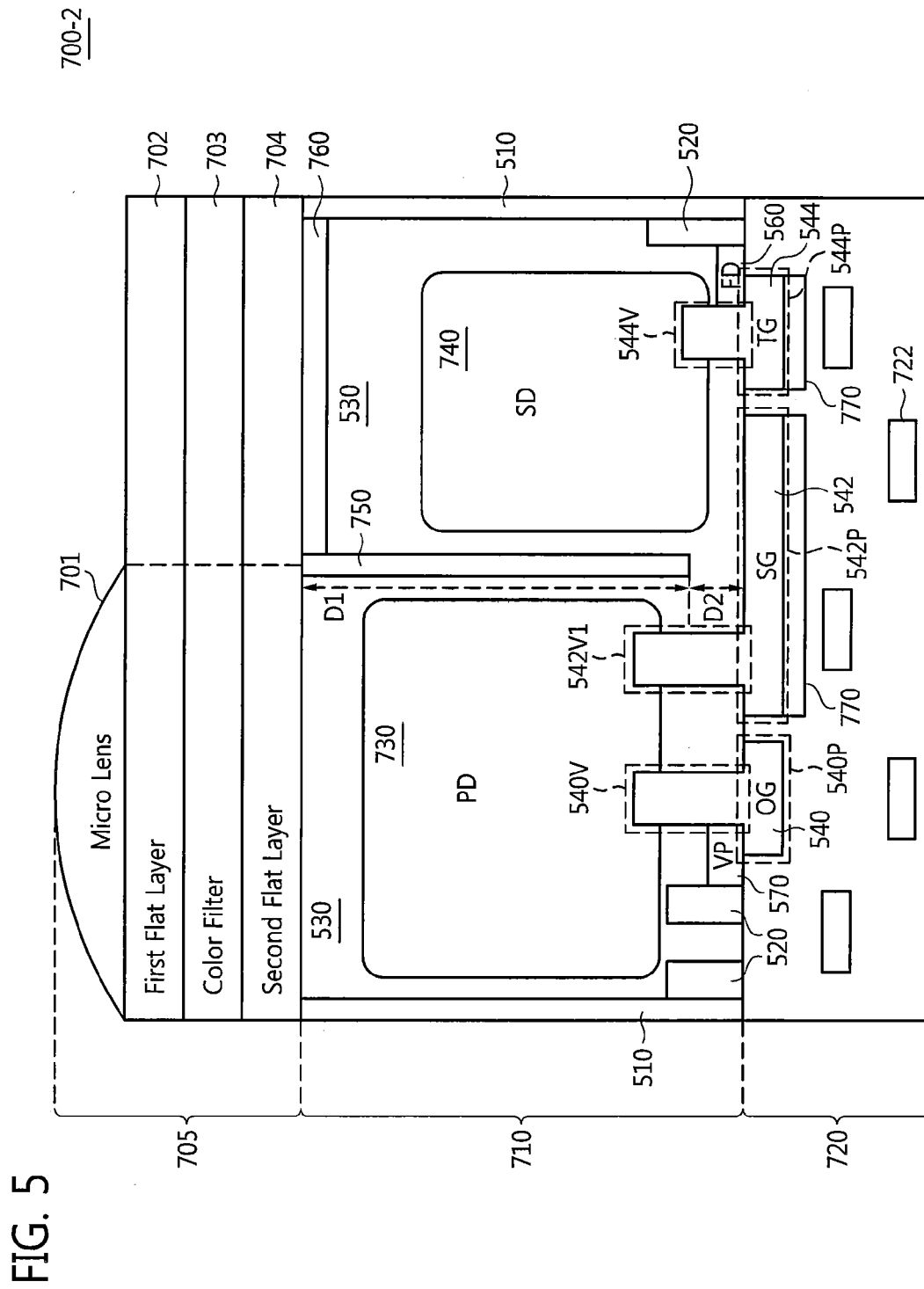
FIG. 5 is a cross-sectional view of the pixel illustrated in FIG. 3 according to some embodiments of the inventive concepts.
Figure 6:
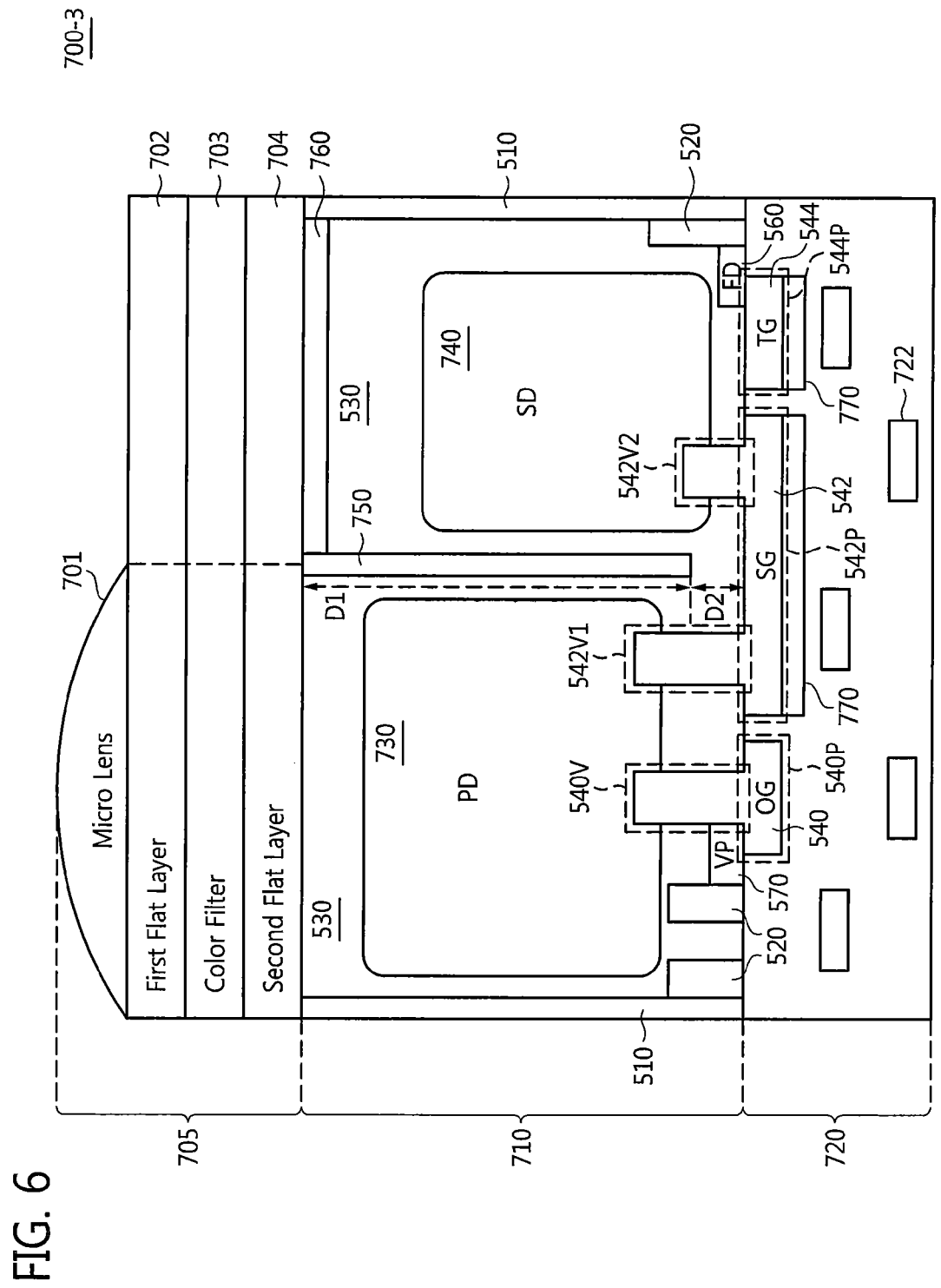
FIG. 6 is a cross-sectional view of the pixel illustrated in FIG. 3 according to some embodiments of the inventive concepts.
Figure 7:
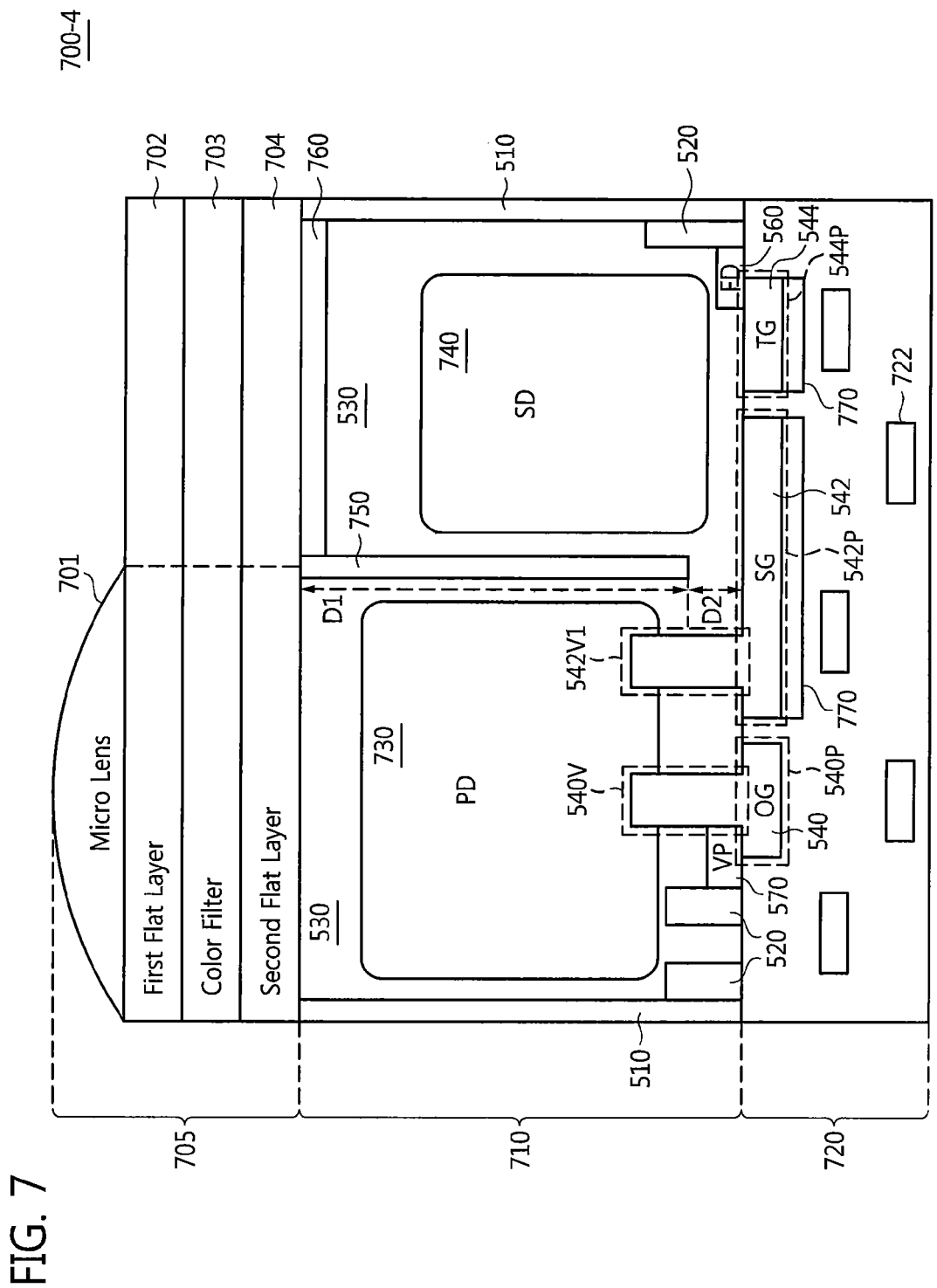
FIG. 7 is a cross-sectional view of the pixel illustrated in FIG. 3 according to some embodiments of the inventive concepts.

FIG. 4 is a cross-sectional view of a pixel 700-1 having the layout 500 illustrated in FIG. 3 according to some embodiments of the inventive concepts. FIG. 5 is a cross-sectional view of a pixel 700-2 having the layout illustrated in FIG. 3 according to some embodiments of the inventive concepts. FIG. 6 is a cross-sectional view of a pixel 700-3 having the layout illustrated in FIG. 3 according to some embodiments of the inventive concepts. FIG. 7 is a cross-sectional view of a pixel 700-4 having the layout illustrated in FIG. 3 according to some embodiments of the inventive concepts.

Referring to FIGS. 1 through 7, the pixel 700-1 illustrated in FIG. 4 is an example of the cross-section taken along the line A-A' illustrated in FIG. 3. The pixel 700-1 may include an incidence layer 705, a semiconductor substrate 710, and a wiring layer 720.

The incidence layer 705 may include a micro lens 701, a first flat layer 702, a color filter 703, and a second plat layer 704. The micro lens 701 may be formed at the top (which is assumed to be a position at which incident light first arrives) of the pixel 700-1 to correspond to a photo diode PD or 730. The micro lens 701 may be used to increase a light gathering power and thus to increase image quality. The micro lens 701 may be the micro lens 50 illustrated in FIG. 2.

The color filter 703 may be formed below the micro lens 701. The color filter 703 may selectively transmit light with a predetermined wavelength (e.g., red, green, blue magenta, yellow, or cyan).

The first flat layer 702 and the second flat layer 704 may be respectively formed above and below the color filter 703 to possibly prevent light coming through the micro lens 701 and the color filter 703 from being reflected. In other words, the first flat layer 702 and the second flat layer 704 transmit incident light efficiently, thereby increasing the performance (such as light absorptance and photosensitivity) of the image sensor 110.

The semiconductor substrate 710 may include the DTI region 510, the STI 520, the well area 530, the gate 540 of the overflow transistor OX, the gate 542 of the storage transistor SX, the gate 544 of the transfer transistor TX, the floating diffusion 560, the pixel voltage terminal 570, the photo diode 730, a storage diode SD or 740, a second DTI 750, a light shielding film 760, and a metal shield 770. The elements 510, 520, 530, 540, 545, 544, 560, and 570 illustrated in FIG. 4 have been described with reference to FIG. 3. The gate 540 of the overflow transistor OX, the gate 542 of the storage transistor SX, and the gate 544 of the transfer transistor TX may have at least one vertical gate structure.

The gate 540 of the overflow transistor OX may include a planar gate 540P parallel to a plane (formed opposite to the second flat layer 704 in parallel with the second flat layer 704) of the semiconductor substrate 710 and a vertical gate 540V extending toward the photo diode PD. For instance, the vertical gate 540V may have a structure extending from the planar gate 540P toward the photo diode PD. The gate 542 of the storage transistor SX may include a planar gate 542P parallel to the plane of the semiconductor substrate 710, a vertical gate 542V1 extending toward the photo diode PD, and a vertical gate 542V2 extending toward the storage diode SD. For instance, the vertical gate 542V1 may have a structure extending from the planar gate 542P toward the photo diode PD, and the vertical gate 542V2 may have a structure extending from the planar gate 542P toward the storage diode SD. The gate 544 of the transfer transistor TX may include a planar gate 544P parallel to the plane of the semiconductor substrate 710 and a vertical gate 544V extending toward the storage diode SD. For instance, the vertical gate 544V may have a structure extending from the planar gate 544P toward the photo diode PD.

The vertical gate structure may be formed using a trench process. The trench process is a process of forming a trench in the semiconductor substrate 710 with a certain depth. The trench process may be divided into a DTI process providing a relatively deeper trench and an STI process providing a relatively shallower trench. The trench process may also be divided into a back trench process in which a trench is formed starting from the side of the incidence layer 705 and a front trench process in which a trench is formed starting from the side of the wiring layer 720.

The vertical gate structure may be formed using the front trench process. The gates 540, 542, and 544 of the respective transistors OX, SX, and TX may be formed using the DTI or STI process according to the vertical depth of the photo diode 730 and the vertical depth of the storage diode 740. The vertical gate structure may also be formed inserted into the photo diode PD or the storage diode SD, as shown in FIG. 4, but the inventive concepts is not limited thereto. The vertical gate structure may be separated from the photo diode PD or the storage diode SD by a predetermined distance in some embodiments.

The vertical gates 540V, 542V1, 542V2, and 544V of the gates 540, 542, and 544 of the respective transistors OX, SX, and TX are formed to extend toward the photo diode PD or storage diode SD, so that a channel is readily formed between the pixel voltage terminal 570 and the photo diode PD, between the photo diode PD and the storage diode SD, and between the storage diode SD and the floating diffusion 560. As a result, the transfer efficiency of photocharges is increased.

Since the gates 540, 542, and 544 of the respective transistors OX, SX, and TX include the vertical gates 540V, 542V1, 542V2, and 544V, the photo diode 730 and the storage diode 740 may not need to be formed close to a surface (i.e., the surface on which the elements 560 and 570 are formed) of the semiconductor substrate 710 but may be formed in the middle of the semiconductor substrate 710. In other words, the gates 540, 542, and 544 of the respective transistors OX, SX, and TX need to be close to the photo diode 730 or the storage diode 740 for the normal operation of the pixel 700-1. Therefore, when the gates 540, 542, and 544 of the respective transistors OX, SX, and TX includes only the planar gates 540P, 542P, and 544P, the photo diode 730 or the storage diode 740 should be formed in a narrow area corresponding to each of the gates 540, 542, and 544 of the respective transistors OX, SX, and TX. However, when the gates 540, 542, and 544 of the respective transistors OX, SX, and TX includes the vertical gates 540V, 542V1, 542V2, and 544V as shown in FIG. 4, the photo diode 730 or the storage diode 740 may be formed across the entire flat area of the photo diode area PA22 or the storage diode area SA22.

Accordingly, when the gates 540, 542, and 544 of the respective transistors OX, SX, and TX have the vertical gate structure, the maximum number of storable charges, i.e., full well capacity (FWC) and sensitivity of the photo diode 730 or the storage diode 740 are increased.

The FWC of the photo diode 730 may be defined as the product of the volume of the photo diode 730 and the electric potential of the photo diode 730. When the gates 540, 542, and 544 of the respective transistors OX, SX, and TX have the vertical gate structure, the volume of the photo diode 730 increases. At this time, the electric potential, i.e., pinning voltage of the photo diode 730 may be designed low by allowing the volume of the photo diode 730 to increase within a range of the FWC required for the normal operation of the pixel 10. The operation of the pixel 10 in association with the low electric potential of the photo diode 730 will be described with reference to FIGS. 10A through 10F later.

A gate insulation layer (not shown) may be formed between the gates 540, 542, and 544 of the respective transistors OX, SX, and TX and the semiconductor substrate 710. The gate insulation layer may be formed of $SiO_2$, SiON, SiN, $Al_2O_3$, $Si_3N_4$, $Ge_xO_yN_z$, $Ge_xSi_yO_z$, or a high-dielectric material. The high-dielectric material may be formed by performing atomic layer deposition using $HfO_2$, $ZrO_2$, $Al_2O_3$, $Ta_2O_5$, hafnium silicate, zirconium silicate, or a combination thereof.

Figure 8:
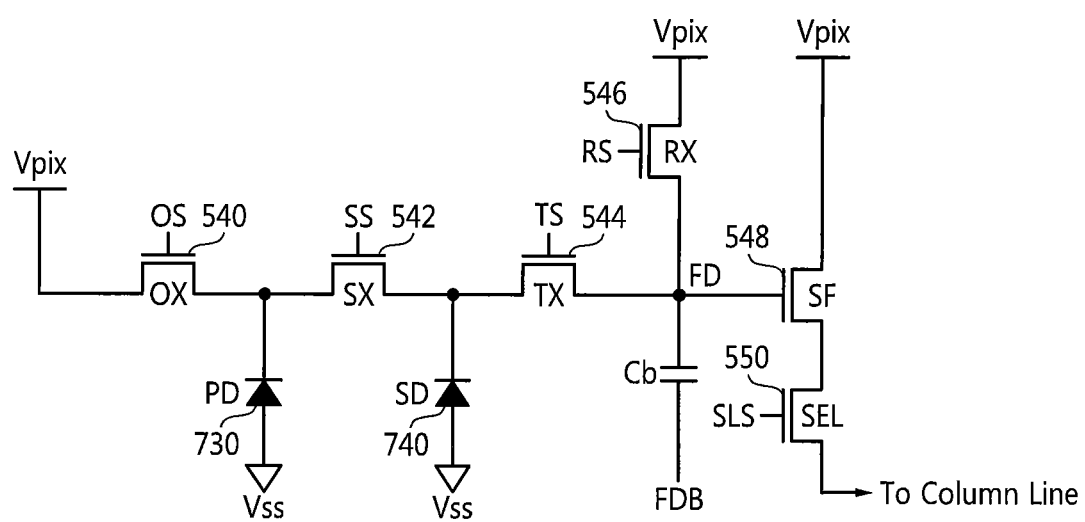
FIG. 8 is a circuit diagram of a pixel corresponding to the pixel illustrated in FIG. 3.

The photo diode 730 and the storage diode 740 may be the photo diode PD and the storage diode SD illustrated in FIG. 8. Each of the photo diode 730 and the storage diode 740 may be formed as an n-type or p-type region in the well area 530 using ion implantation. It is assumed that the well area 530 is a p-type and the photo diode 730 and the storage diode 740 are an n-type, for convenience' sake in the description.

In some embodiments, the photo diode 730 and the storage diode 740 may be formed by stacking a plurality of doped regions. In this case, a lower doped region may be formed using implantation of n+ ions and an upper doped region may be formed using implantation of n− ions.

The storage diode 740 may be formed to have a different thickness than the photo diode 730, as shown in FIG. 4, thereby facilitating transfer of photocharges stored in the storage diode 740. The photo diode 730 may be formed across most of the photo diode area PA22 except for the DTI region 510 and the second DTI 750 to obtain a high fill factor. The fill factor may be defined as a ratio of a light receiving area to a pixel area. The higher the fill factor, the higher the light absorptance. The DTI region 510 may be referred to as a first DTI.

The second DTI 750 may be formed between the photo diode 730 and the storage diode 740. The second DTI 750 may have a first length D1 that covers the vertical area of the photo diode 730 and the storage diode 740. The inside of the second DTI 750 may be formed of substantially the same material as the DTI region 510 using the back trench process.

In other words, the second DTI 750 may reduce or possibly prevent electrical crosstalk and optical crosstalk between the photo diode 730 and the storage diode 740. In particular, the second DTI 750 may block incident light passing through the photo diode area PA22, thereby possibly preventing the storage diode 740 from storing charges other than those transferred from the photo diode 730.

The second DTI 750 may be separated by a second length D2 from the surface of the semiconductor substrate 710. The second length D2 may be a minimum length to form a channel for transfer of charges between the photo diode 730 and the storage diode 740.

The light shielding film 760 is formed on or above the storage diode 740 to have an area corresponding to the storage diode 740. The light shielding film 760 may block light incident on the storage diode 740 through the incidence layer 705. The light shielding film 760 may be formed of, for example, tungsten, but the inventive concepts are not limited thereto.

The metal shield 770 is formed on the bottom of the gates 542 and 544 of the respective transistors SX and TX to have an area corresponding to the gates 542 and 544 of the respective transistors SX and TX. The metal shield 770 may block light that has been reflected from multi-layer conductive lines 722 toward the storage diode 740.

The DTI region 510, the second DTI 750, the light shielding film 760, and the metal shield 770 may be form a light shielding unit that blocks light incident on the storage diode SD. In other words, light leakage may be reduced or possibly minimized by the DTI region 510, the second DTI 750, the light shielding film 760, and the metal shield 770.

For instance, when the pixel array 120 includes a plurality of rows operated in global shutter mode, a sampling time for accumulated photocharges is different row by row even though an integration time is uniform throughout all rows. When the light shielding unit does not exist, noise occurs in the pixel signals P1 through Pm during the sampling time due to light leakage. The light shielding unit reduce or possibly minimizes the light leakage, thereby reducing or possibly preventing noise from occurring due to different sampling times.

The wiring layer 720 may include the multi-layer conductive lines 722. The multi-layer conductive lines 722 may transmit the control signals OS, SS, TS, RS, and SLS applied to the transistors OX, SX, TX, RX, and SEL or may transmit a signal between the pixel 700-1 and the outside. The multi-layer conductive lines 722 may be formed by patterning a conductive material including metal such as copper or aluminum.

As shown in FIG. 4, the pixel 700-1 may be formed as a backside illumination (BSI) pixel in which the multi-layer conductive lines 722 are positioned at an opposite side of the semiconductor substrate 710 to face the incidence layer 705. However, the inventive concepts are not limited thereto.

The pixels 700-2, 700-3, and 700-4 illustrated in FIGS. 5 through 7 are substantially the same as the pixel 700-1 illustrated in FIG. 4 except for several differences. Thus only these differences will be described.

The pixel 700-2 illustrated in FIG. 5 is the cross-section taken along the line A-A' illustrated in FIG. 3 according to some embodiments of the inventive concepts. The gate 542 of the storage transistor SX may include only the planar gate 542P and the vertical gate 542V1 extending toward the photo diode PD and may not include the vertical gate 542V2 extending toward the storage diode SD in the pixel 700-2, unlike in the pixel 700-1 illustrated in FIG. 4.

The pixel 700-3 illustrated in FIG. 6 is the cross-section taken along the line A-A' illustrated in FIG. 3 according to some embodiments of the inventive concepts. The gate 544 of the transfer transistor TX may include only the planar gate 544P and may not include the vertical gate 544V extending toward the storage diode SD in the pixel 700-3, unlike in the pixel 700-1 illustrated in FIG. 4.

The pixel 700-4 illustrated in FIG. 7 is the cross-section taken along the line A-A' illustrated in FIG. 3 according to some embodiments of the inventive concepts. Each of the gate 542 of the storage transistor SX and the gate 544 of the transfer transistor TX may not include the vertical gate 542V2 or 544V extending toward the storage diode SD in the pixel 700-4, unlike in the pixel 700-1 illustrated in FIG. 4.

FIG. 8 is a circuit diagram of a pixel 550 corresponding to the layout 500 illustrated in FIG. 3. Referring to FIGS. 1 through 8, the pixel 550 may operate in global shutter mode. The pixel 550 includes the photo diode PD, the overflow transistor OX, the storage transistor SX, the transfer transistor TX, a boosting capacitor Cb, the reset transistor RX, the source follower SF, and the select transistor SEL.

The photo diode PD accumulates or collects photocharges generated therein response to incident light. The overflow transistor OX is connected between the pixel voltage terminal VP supplying the pixel voltage Vpix and the photo diode PD. The gate OG of the overflow transistor OX is used to possibly prevent charges generated by the photo diode PD from overflowing into the storage diode SD. The overflow transistor OX is turned on or off in response to the overflow control signal OS. The gate 540 of the overflow transistor OX may be referred to as an overflow gate OG.

For instance, when the intensity of light incident on the pixel 550 is high (e.g., when the sun or a light is shot, that is, in case of a white level) or when photocharges generated during a time other than the integration time Tint are collected at the photo diode PD, the overflow transistor OX is used to possibly prevent photocharges (e.g., electrons) generated in the photo diode PD from overflowing into the storage diode SD.

In addition, the overflow transistor OX is also used to remove or reset photocharges that have been accumulated at the photo diode PD right before the start of the integration time Tint.

The storage transistor SX is connected between the photo diode PD and the storage diode SD. Charges transferred from the photo diode PD are stored in the storage diode SD through the storage transistor SX. The storage transistor SX is turned on or off in response to the storage control signal SS applied to its gate SG. The gate 542 of the storage transistor SX may be referred to as a storage gate SG.

The transfer transistor TX is connected between the storage diode SD and the floating diffusion FD. Charges stored in the storage diode SD are stored or accumulated in the floating diffusion FD through the transfer transistor TX. The transfer transistor TX is turned on or off in response to the transfer control signal TS applied its gate TG. The gate 544 of the transfer transistor TX may be referred to as a transfer gate TG.

The boosting capacitor Cb has a first end connected to the floating diffusion FD and a second end receiving the boosting signal FDB. The boosting capacitor Cb may be charged in response to the boosting signal FDB and may boost the floating diffusion FD to an electric potential higher than the pixel voltage Vpix at the moment the transfer transistor TX is turned on. Although the boosting capacitor Cb is not illustrated in FIGS. 3 through 7, it may be formed around the floating diffusion FD.

The reset transistor RX is connected between the pixel voltage terminal VP supplying the pixel voltage Vpix and the floating diffusion FD. The reset transistor RX may control transmission of photocharges (e.g., electrons) from the floating diffusion FD to the pixel voltage terminal VP in response to the reset control signal RS. In other words, when the reset transistor RX is turned on, the voltage level of the floating diffusion FD may be reset to the pixel voltage Vpix. The gate 546 of the reset transistor RX may be referred to as a reset gate RG.

The source follower SF is connected between the pixel voltage terminal VP supplying the pixel voltage Vpix and the select transistor SEL. The source follower SF operates based on a voltage level determined by charges at the floating diffusion FD. The gate 548 of the source follower SF may be referred to as a source follower gate SFG.

The pixel voltage Vpix is applied in common to the overflow transistor OX, the reset transistor RX, and the source follower SF in the embodiments illustrated in FIG. 8, for convenience' sake in the description. However, operating voltages respectively applied to the overflow transistor OX, the reset transistor RX, and the source follower SF may be designed to be different from one another.

The select transistor SEL may output an output signal (e.g., an analog pixel signal) of the source follower SF to a column line in response to the selection control signal SLS. The gate 550 of the select transistor SEL may be referred to as a select gate SELG.

Figure 9:
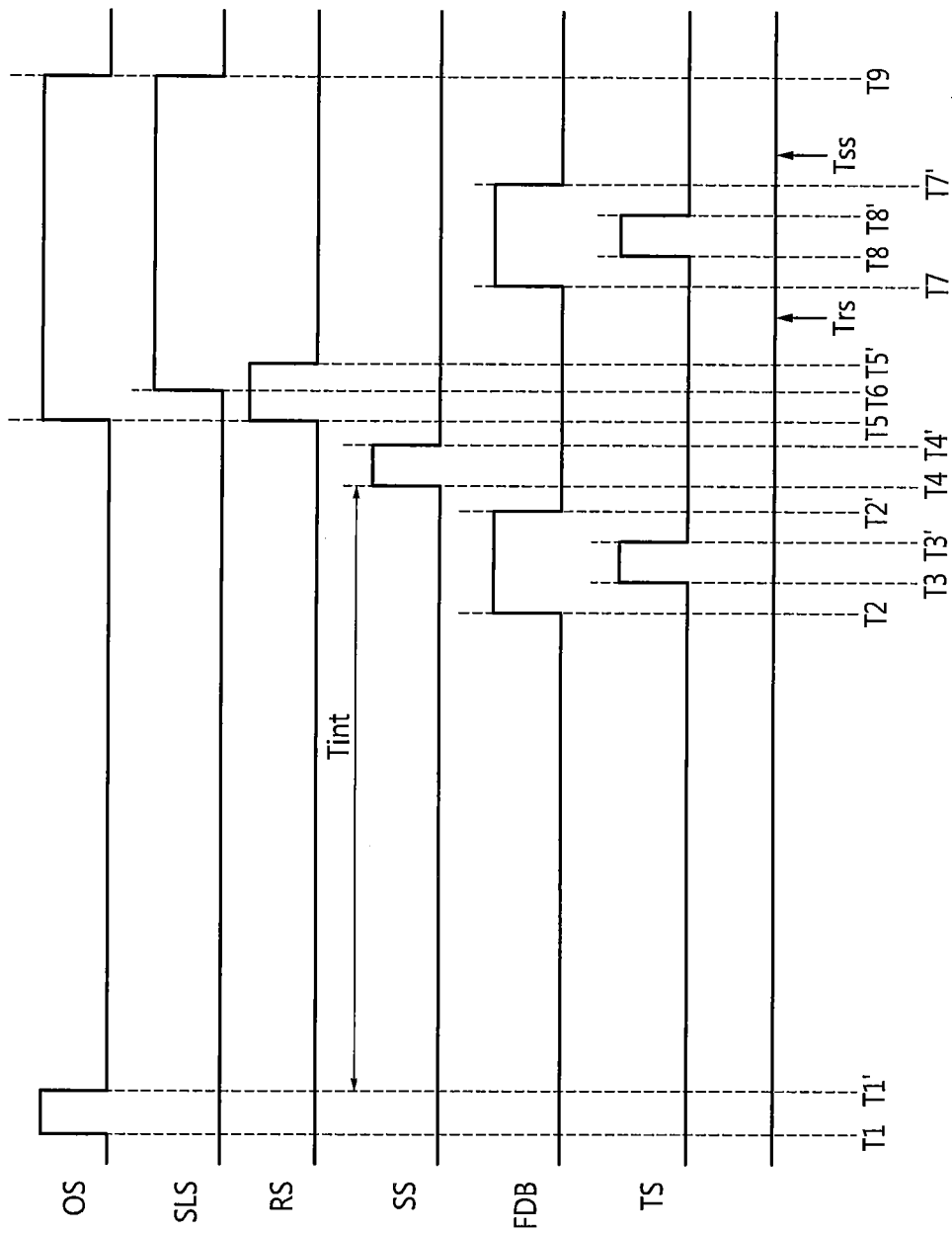
FIG. 9 is a timing chart showing operation of the pixel illustrated in FIG. 8.

FIG. 9 is a timing chart showing the operation of the pixel 550 illustrated in FIG. 8. FIGS. 10A through 10F are electric potential diagrams at different time points illustrated in FIG. 9. Referring to FIGS. 1 through 10F, the operation of the pixel 550 in accordance with the control signals OS, RS, SS, TS, FDB, and SLS illustrated in FIG. 8 will be described with reference to FIG. 9.

The electric potential diagrams illustrated in FIGS. 10A through 10F show electric potential of the overflow gate OG, the photo diode PD, the storage gate SG, the storage diode SD, the transfer gate TG, the floating diffusion FD, and the reset gate RG. The lower the arrow of the electric potential runs, the higher the electric potential.

The overflow control signal OS transits to a high level at a time point T1. As the overflow control signal OS transits to the high level, charges in the photo diode PD are discharged to the pixel voltage terminal VP so that the photo diode PD is reset. At this time, the efficiency of photocharge transfer from the photo diode PD to the pixel voltage terminal VP increases due to the vertical gate 540V in the gate 540 of the overflow transistor OX, so that the complete reset of the photo diode PD is accomplished. After the reset of the photo diode PD is completed at a time point T1' when the overflow control signal OS transits to a low level, accumulation of photocharges in the photo diode PD starts.

Figure 10A:
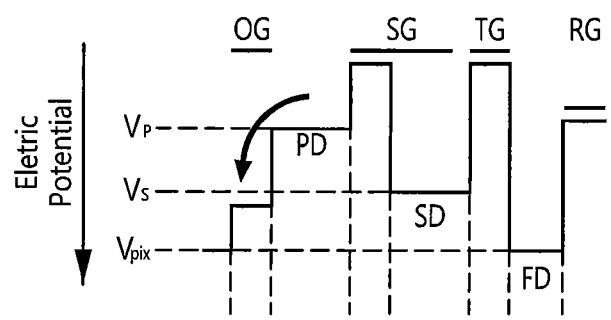
FIGS. 10A through 10F are electric potential diagrams at different time points illustrated in FIG. 9.

FIG. 10A is the electric potential diagram obtained between the time points T1 and T1'. As the overflow control signal OS transits to the high level, the charges in the photo diode PD are discharged to the pixel voltage terminal VP having the pixel voltage Vpix.

Figure 10B:
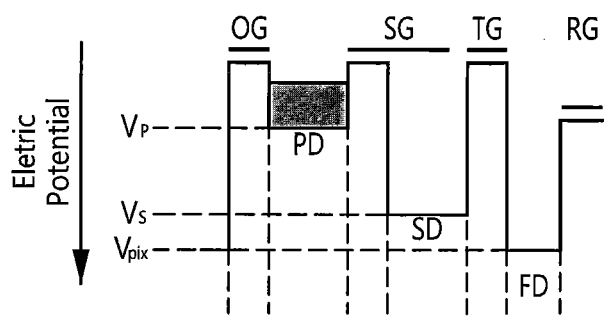

FIG. 10B is the electric potential diagram obtained between time points T1' and T2. As the overflow control signal OS transits to the low level, accumulation of photocharges in the photo diode PD starts. During the integration time Tint or first period defined by time points T1' and T4, the photo diode PD accumulates charges corresponding to incident light.

The boosting signal FDB transits to a high level at the time point T2. As the boosting signal FDB transits to the high level, the boosting capacitor Cb may be charged during a period from the time point T2 to a time point T2'.

The transfer control signal TS transits to a high level at a time point T3. The boosting capacitor Cb may boost the floating diffusion FD to a boosting potential Vb higher than the pixel voltage Vpix the moment the transfer transistor TX is turned on. The charges of the storage diode SD are discharged to the floating diffusion FD so that the storage diode SD is reset. Since the difference between an electric potential Vs of the storage diode SD and an electric potential of the floating diffusion FD increases due to the boosting, transfer efficiency also increases.

Figure 10C:
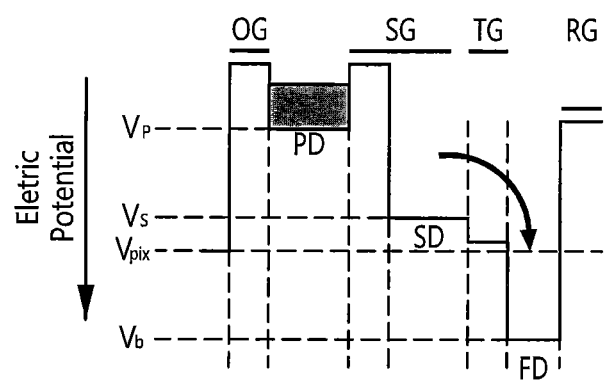

FIG. 10C is the electric potential diagram obtained between time points T3 and T3'. The charges in the storage diode SD are discharged to the floating diffusion FD having the boosting potential Vb.

The storage control signal SS transits to a high level at the time point T4. When storage control signal SS transits to the high level, an electric potential of the storage diode SD is temporarily increased to an electric potential Vs' due to boosting effect between the storage diode SD and the storage transistor SX. In addition, due to the vertical gate 542V1 of the gate 542 of the storage transistor SX and the photo diode 730 formed deep in the semiconductor substrate 710, as shown in FIGS. 4 through 7, the electric potential Vp of the photo diode 730 may be designed lower than the electric potential Vs of the storage diode SD. As a result, the electric potential difference between the photo diode PD and the storage diode SD increases, so that charges accumulated in the photo diode PD may be completely transferred to and stored in the storage diode SD through the storage transistor SX.

Figure 10D:
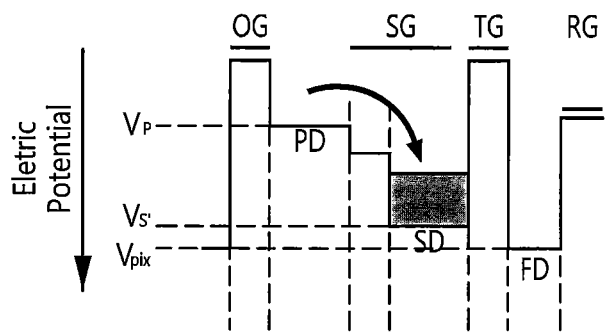

FIG. 10D is the electric potential diagram obtained between time points T4 and T4'. The charges accumulated at the photo diode PD having the low electric potential Vp are completely transferred to and stored in the storage diode SD temporarily having the high electric potential Vs' through the storage transistor SX.

The overflow control signal OS and the reset control signal RS transit to the high level at a time point T5. As the overflow control signal OS transits to the high level, charges in the photo diode PD are discharged to the pixel voltage terminal VP, so that the charges in the photo diode PD do not overflow into the storage diode SD during a period from the time point T5 to a time point T9.

As the reset control signal RS transits to the high level, charges at the floating diffusion FD, which have been transferred from the storage diode SD, are discharged to the pixel voltage terminal VP.

Figure 10E:
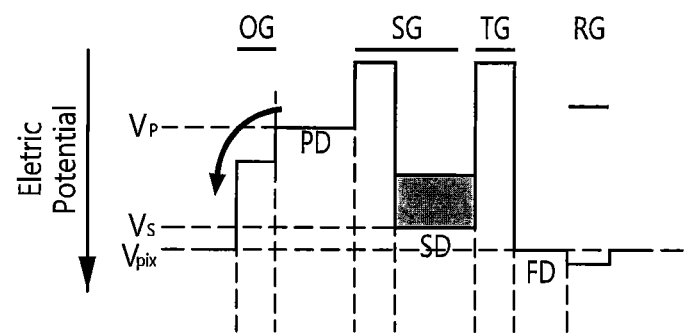

FIG. 10E is the electric potential diagram obtained between time points T5 and T5'. As the overflow control signal OS and the reset control signal RS transit to the high level, the photo diode PD and the floating diffusion FD are reset. The select control signal SLS transits to a high level at a time point T6 and the reset control signal RS transits to a low level at the time point T5'.

A reset signal is sampled at a time point Trs. The reset signal may be a pixel signal output according to a voltage level of the floating diffusion FD right after the floating diffusion FD is reset to the pixel voltage Vpix. The sampling of the reset signal may be carried out by the CDS block 150 and the comparator block 152.

The boosting signal FDB transits to a high level at a time point T7. As the boosting signal FDB transits to the high level, the boosting capacitor Cb may be charged during a period between time points T7 and T7'.

The transfer control signal TS transits to the high level at a time point T8. The boosting capacitor Cb may boost the floating diffusion FD to the boosting potential Vb higher than the pixel voltage Vpix the moment the transfer transistor TX is turned on. As the transfer control signal TS transits to the high level, charges stored in the storage diode SD are transferred to the floating diffusion FD. As described above, since the difference between the electric potential Vs of the storage diode SD and the electric potential of the floating diffusion FD increases due to the boosting, transfer efficiency also increases.

Figure 10F:
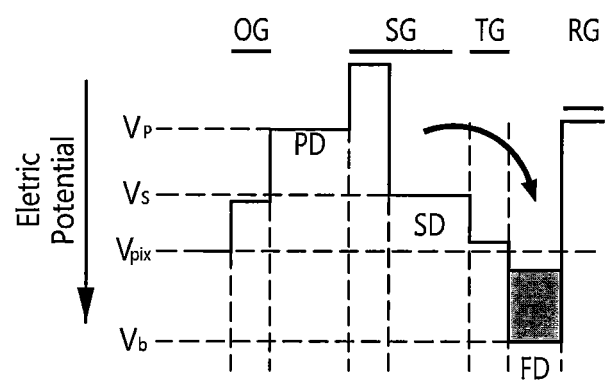

FIG. 10F is the electric potential diagram obtained between time points T8 and T8'. The charges stored in the storage diode SD may be completely transferred to and accumulated at the floating diffusion FD having the boosting potential Vb.

An image signal is sampled at a time point Tss. The image signal may be a pixel signal output according to a voltage level of the floating diffusion FD right after the charges are completely transferred from the storage diode SD to the floating diffusion FD. The sampling of the image signal may be carried out by the CDS block 150 and the comparator block 152. When the select control signal SLS transits to a low level at the time point T9, the sampling operation on the floating diffusion FD is completed.

The gates OG and SG of the transistors OX and SX controlling transfer of charges from the photo diode PD are formed as vertical gates in the image sensor 110 according to some embodiments of the inventive concepts, so that the FWC of the photo diode PD and the charge transfer efficiency are increased. Due to the increased FWC and charge transfer efficiency, the sensitivity of the image sensor 110 increases and the occurrence of noise decreases.

Since the electric potential Vp of the photo diode 730 can be designed low, the pixel voltage Vpix corresponding to an electric potential used by the reset transistor RX to reset the floating diffusion FD can be designed lower than a usual voltage (e.g., the power supply voltage VDD) within a certain range of transfer efficiency. In addition, since the electric potential Vp of the photo diode 730 can be designed low, the pixel voltage Vpix corresponding to an electric potential used by the overflow transistor OX to reset the photo diode PD can be designed lower than the usual voltage (e.g., the power supply voltage VDD).

Consequently, power consumption of the image sensor 110 is decreased since the electric potential of the photo diode PD and the voltage Vpix applied to the pixels 10 are designed low.

Figure 11:
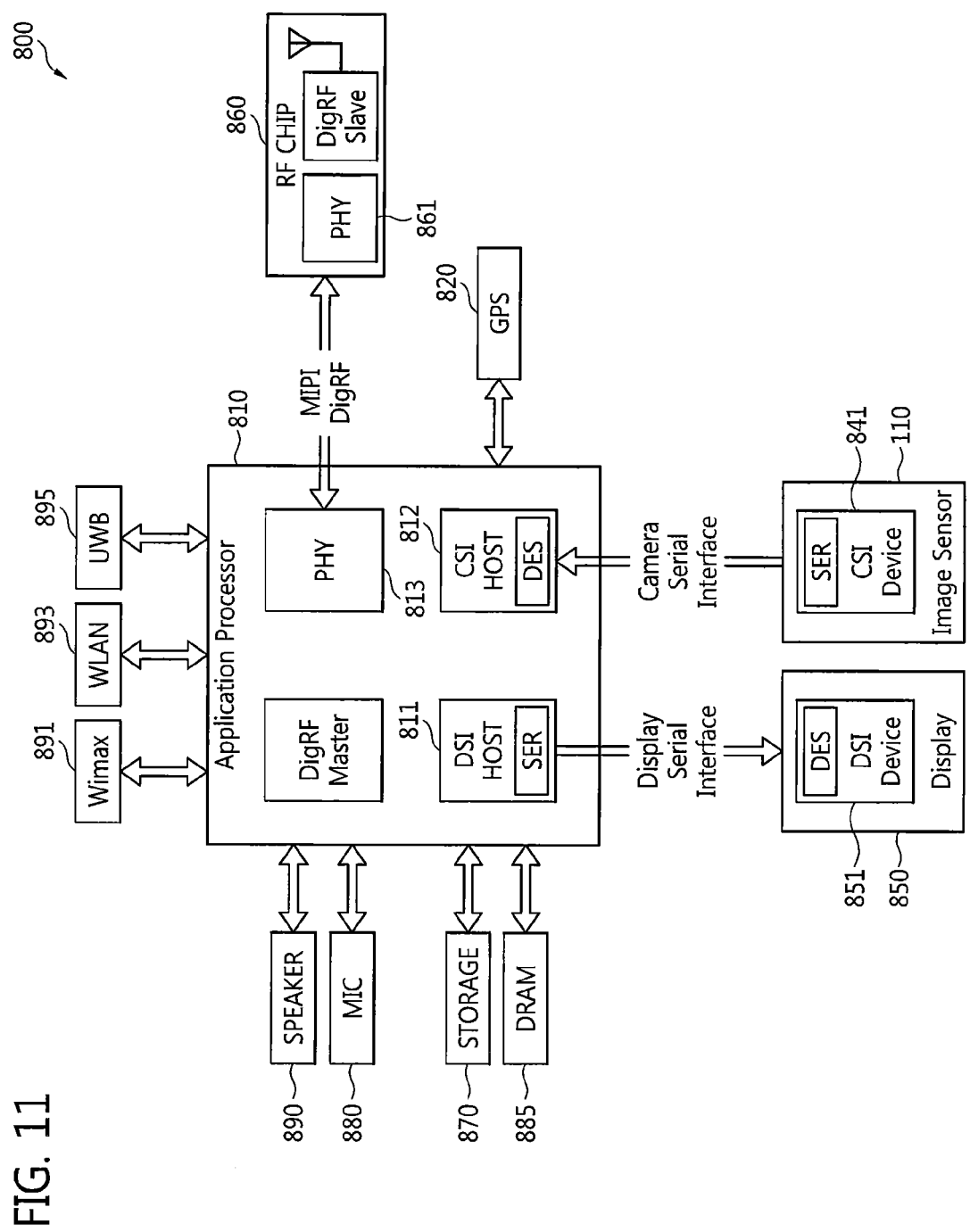
FIG. 11 is a block diagram of an electronic system including an image sensor according to some embodiments of the inventive concepts.

FIG. 11 is a block diagram of an electronic system 800 including an image sensor according to some embodiments of the inventive concepts. Referring to FIGS. 1 and 11, the electronic system 800 may be implemented as a data processing device, such as a cellular phone, a PDA, a PMP, an internet protocol television (IPTV), or a smart phone, which can use or support mobile industry processor interface (MIPI). The electronic system 800 includes the image sensor 110, an application processor 810, and a display 850.

A camera serial interface (CSI) host 812 in the application processor 810 may perform serial communication with a CSI device 841 in the image sensor 110 through CSI. An optical deserializer DES and an optical serializer SER may be included in the CSI host 812 and the CSI device 841, respectively.

A display serial interface (DSI) host 811 in the application processor 810 may perform serial communication with a DSI device 851 in the display 850 through DSI. An optical serializer SER and an optical deserializer DES may be included in the DSI host 811 and the DSI device 851, respectively.

The electronic system 800 may also include a radio frequency (RF) chip 860 communicating with the application processor 810. A physical layer (PHY) 813 in the application processor 810 and a PHY 861 in the RF chip 860 may communicate data with each other according to MIPI DigRF.

The electronic system 800 may further include a global positioning system (GPS) 820, a storage 870, a microphone (MIC) 880, a dynamic random access memory (DRAM) 885, and a speaker 890. The electronic system 800 may communicate using worldwide interoperability for microwave access (Wimax) 891, wireless local area network (WLAN) 893, and/or ultra wideband (UWB) 895.

Figure 12:
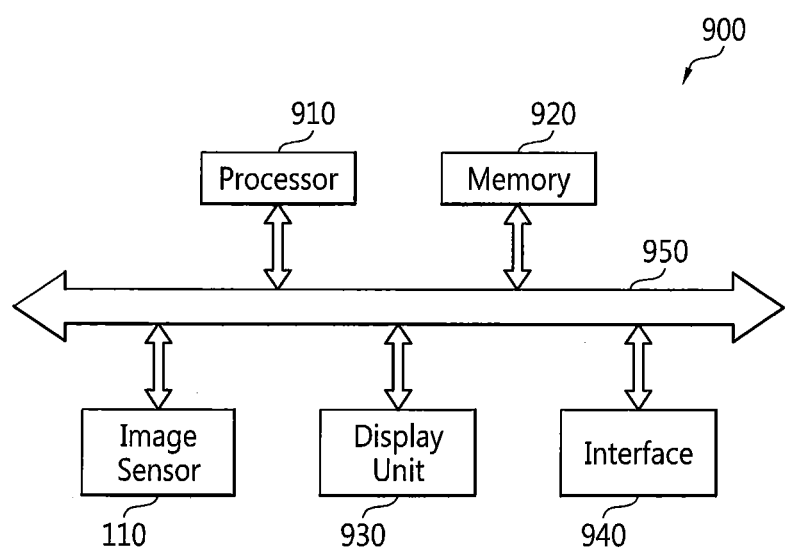
FIG. 12 is a block diagram of an electronic system including an image sensor according to some embodiments of the inventive concepts.

FIG. 12 is a block diagram of an electronic system 900 including an image sensor according to some embodiments of the inventive concepts. Referring to FIGS. 1 and 12, the electronic system 900 may include the image sensor 110, a processor 910, a memory 920, a display unit 930, and an interface 940.

The processor 910 may control the operation of the image sensor 110. The processor 910 may process pixel signals output from the image sensor 110 and generate image data.

The memory 920 may store a program for controlling the operation of the image sensor 110 and may store image data generated by the processor 910. The processor 910 may execute the program stored in the memory 920. The memory 920 may be formed with volatile or non-volatile memory.

The display unit 930 may display the image data output from the processor 910 or the memory 920. The display unit 930 may be a liquid crystal display (LCD), an LED display, an OLED display, an AMOLED display, or a flexible display.

The interface 940 may be formed for the input and output of image data. The interface 940 may be implemented as a wireless interface.

The inventive concepts can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices.

The computer readable recording medium can also be distributed over network coupled computer systems so that the computer readable code is stored and executed in a distributed fashion. Also, functional programs, codes, and code segments for accomplishing the inventive concepts can be easily construed by programmers skilled in the art to which the inventive concepts belong.

As described above, according to some embodiments of the inventive concepts, a gate of a certain transistor is formed as a vertical gate in a pixel, thereby increasing the sensitivity of the pixel and decreasing noise in pixel signals in an image sensor and an image processing system. In addition, an electric potential of a photo diode of the pixel and a voltage applied to the pixel are designed low, thereby decreasing power consumption.

While the inventive concepts have been particularly shown and described with reference to example embodiments thereof, it will be understood by those of ordinary skill in the art that various changes in forms and details may be made therein without departing from the spirit and scope of the inventive concepts as defined by the following claims.

What is claimed is:

1. A pixel of an image sensor, the pixel comprising:
   a photo diode that is configured to accumulate photocharges generated therein corresponding to incident light during a first period;
   a storage diode that is configured to store photocharges accumulated in the photo diode; and
   a storage gate that is configured to control transfer of the photocharges accumulated in the photo diode to the storage diode, the storage gate comprising a vertical gate structure extending toward the photo diode, and the store gate being overlapped by both the photo diode and the storage diode in plan view.

2. The pixel of claim 1, wherein the vertical gate structure comprises a first vertical gate structure, and
   wherein the pixel further comprises an overflow gate that is configured to control overflow of the photocharges accumulated in the photo diode into the storage diode during a second period that is different from the first period, the overflow gate comprising a second vertical gate structure extending toward the photo diode.

3. The pixel of claim 1, wherein the vertical gate structure comprises a first vertical gate structure, and
   wherein the pixel further comprises:
   a floating diffusion that is configured to receive the photocharges stored in the storage diode; and
   a transfer gate that is configured to control transfer of the photocharges stored in the storage diode to the floating diffusion, the transfer gate comprising a second vertical gate structure extending toward the storage diode.

4. The pixel of claim 1, wherein the vertical gate structure comprises a first vertical gate structure, and
   wherein the storage gate further comprises a second vertical gate structure extending toward the storage diode.

5. The pixel of claim 1, further comprising:
   a photo diode area comprising the photo diode; and
   a storage diode area comprising the storage diode,
   wherein the photo diode area and the storage diode area are arranged aslant with respect to either of a row direction or a column direction in plan view.

6. The pixel of claim 1, further comprising a floating diffusion that is configured to receive the photocharges stored in the storage diode, wherein a voltage level of the floating diffusion is sensed by an adjacent pixel.

7. The pixel of claim 1, wherein a portion of the vertical gate structure extends into the photo diode.

8. An image sensor that is configured to operate in global shutter mode, the image sensor comprising:
   a pixel array comprising a plurality of pixels, each of the plurality of pixels outputs a pixel signal corresponding to incident light during a first period;
   a readout circuit that is configured to perform analog-to-digital conversion on the pixel signal to generate a digital pixel signal; and
   a timing generator that is configured to control the pixel array and the readout circuit,
   wherein each of the plurality of pixels comprises:
   a photo diode that is configured to accumulate photocharges generated therein corresponding to the incident light during the first period;
   a storage diode that is configured to store photocharges accumulated in the photo diode; and
   a storage gate that is configured to control transfer of the photocharges accumulated in the photo diode to the storage diode, the storage gate comprising a vertical gate structure extending toward the photo diode, and the storage gate being overlapped by both the photo diode and the storage diode in plan view.

9. The image sensor of claim 8, wherein each of the plurality of pixels further comprises an overflow gate that is configured to control overflow of the photocharges accumulated in the photo diode into the storage diode during a second period that is different from the first period,
   wherein the vertical gate structure comprises a first vertical gate structure extending toward the photo diode, and
   wherein the overflow gate comprises a second vertical gate structure extending toward the photo diode.

10. The image sensor of claim 8, wherein the vertical gate structure comprises a first vertical gate structure extending toward the photo diode, and
    wherein each of the plurality of pixels further comprises:
    a floating diffusion that is configured to receive the photocharges stored in the storage diode; and
    a transfer gate that is configured to control transfer of the photocharges stored in the storage diode to the floating diffusion, the transfer gate comprising a second vertical gate structure extending toward the storage diode.

11. The image sensor of claim 8, wherein the vertical gate structure comprises a first vertical gate structure extending toward the photo diode, and wherein the storage gate further comprises a second vertical gate structure extending toward the storage diode.

12. The image sensor of claim 8, further comprising a floating diffusion that is configured to receive the photocharges stored in the storage diode, wherein a voltage level of the floating diffusion is sensed by a pixel adjacent each of the plurality of pixels.

13. The image sensor of claim 8, wherein a portion of the vertical gate structure extends into the photo diode.

14. A pixel of an image sensor, the pixel comprising:
a photo diode that is configured to accumulate photocharges generated therein corresponding to incident light;
a storage diode that is configured to store photocharges accumulated in the photo diode, wherein the storage diode and the photo diode are disposed along a first direction; and
a storage gate that is configured to control transfer of the photocharges accumulated in the photo diode to the storage diode, wherein the storage gate comprises a first portion extending in the first direction and a second portion protruding from the first portion and extending toward the photo diode in a second direction that is different from the first direction.

15. The pixel of claim 14, wherein the second portion of the storage gate extends into the photo diode.

16. The pixel of claim 14, wherein the storage gate comprises a third portion protruding from the first portion and extending toward the storage diode.

17. The pixel of claim 16, wherein a length of the second portion of the storage gate in the second direction is greater than a length of the third portion of the storage gate in the second direction.

18. The pixel of claim 14, further comprising an overflow gate that is configured to control overflow of the photocharges accumulated in the photo diode into the storage diode, wherein the overflow gate is spaced apart from the photo diode in the first direction, and wherein the overflow gate comprises a third portion extending in the first direction and a fourth portion protruding from the third portion and extending toward the photo diode.

19. The pixel of claim 14, further comprising:
a floating diffusion that is configured to receive photocharges from the storage diode; and
a transfer gate that is configured to control transfer the photocharges stored in the storage diode to the floating diffusion, wherein the storage diode, the transfer gate and the floating diffusion are arranged in the first direction,
wherein the transfer gate comprises a third portion extending in the first direction and a fourth portion protruding from the third portion and extending toward the storage diode.

20. The pixel of claim 14, wherein the second direction is substantially perpendicular to the first direction.

* * * * *